US009568889B1

(12) United States Patent
Lee

(10) Patent No.: US 9,568,889 B1
(45) Date of Patent: Feb. 14, 2017

(54) TIME TO DIGITAL CONVERTER WITH HIGH RESOLUTION

(71) Applicant: Winbond Electronics Corp., Taichung (TW)

(72) Inventor: Chen-Yi Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/183,752

(22) Filed: Jun. 15, 2016

(51) Int. Cl.
*H03M 1/50* (2006.01)
*G04F 10/00* (2006.01)
*G04F 10/04* (2006.01)

(52) U.S. Cl.
CPC ............. *G04F 10/005* (2013.01); *G04F 10/00* (2013.01); *G04F 10/04* (2013.01)

(58) Field of Classification Search
CPC ......... G04F 10/005; G04F 10/04; G04F 10/00
USPC .................................................. 341/166, 155
See application file for complete search history.

(56) References Cited

U.S. PATENT DOCUMENTS 8,447,548 B2 * 5/2013 McKay ................ G01R 31/002 702/66
8,779,787 B2 * 7/2014 Laplanche ......... G01R 31/2881 324/750.01
8,878,613 B2 * 11/2014 Wang .................... G04F 10/005 327/8
8,970,421 B1 * 3/2015 Gao ...................... G04F 10/005 341/166
9,007,133 B2 * 4/2015 Cremonesi ........... H03K 3/0315 327/141

* cited by examiner

*Primary Examiner* — Brian Young
(74) *Attorney, Agent, or Firm* — Jianq Chyun IP Office

(57) ABSTRACT

A time to digital converter (TDC) with high resolution is provided. The TDC includes a counter, a reference value generator and a comparator. The counter samples an input signal according to a clock signal to calculate a pulse width of the input signal. The reference value generator samples a ruler signal according to the clock signal to generate a reference value. Herein, a frequency of the clock signal is greater than a frequency of the ruler signal, and the frequency of the ruler signal is greater than a frequency of the input signal. The comparator is coupled to the counter and the reference value generator, and compares the pulse width of the input signal and the reference value to generate a count result.

12 Claims, 5 Drawing Sheets

TIME TO DIGITAL CONVERTER WITH HIGH RESOLUTION

BACKGROUND OF THE INVENTION

Field of the Invention

The invention relates to a time to digital converter, and particularly relates to a time to digital converter capable of mitigating environmental interference and with a full-digital application.

Description of Related Art

Along with development of integrated circuit, a more extensive use can be achieved by converting sensing information obtained by a sensor into digital codes. Regarding a time measurement system, a time to digital converter may adopt a time width to represent the sensing information, and counts the time width through an oscillator, so as to convert the sensing information into a digital output.

In the existing techniques, the time to digital converter generally filters a noise part of a time sensing signal by only configuring a comparator at a front stage. However, environmental variations related to manufacturing process, voltage, temperature, etc., probably cause an interference in a counting process. Moreover, demands on high energy conversion efficiency and high precision are gradually increased. Therefore, to effectively resolve the above problem has become a key technique of the time to digital converter.

SUMMARY OF THE INVENTION

The invention is directed to a time to digital converter with high resolution, which is adapted to mitigate a problem of an inaccurate count result caused by environmental interference, so as to implement high resolution, and achieve an advantage of low power consumption.

The invention provides a time to digital converter with high resolution, which includes a counter, a reference value generator and a comparator. The counter samples an input signal according to a clock signal to calculate a pulse width of the input signal. The reference value generator samples a ruler signal according to the clock signal to generate a reference value. A frequency of the clock signal is greater than a frequency of the ruler signal, and the frequency of the ruler signal is greater than a frequency of the input signal. The comparator is coupled to the counter and the reference value generator, and compares the pulse width of the input signal and the reference value to generate a count result.

The invention further provides a time to digital converter with high resolution, which includes a phase-locked loop device, a double edge detecting circuit and a counter. The phase-locked loop device provides a clock signal. The double edge detecting circuit is coupled to the phase-locked loop device, and detects a logic level of the clock signal according to a rising edge and a falling edge of an input signal, and generates a control signal in response to the detected logic level of the clock signal. The counter is coupled to the phase-locked loop device and the double edge detecting circuit, and determines whether to execute a count operation according to the control signal. When the counter executes the count operation, the counter samples the input signal according to the clock signal to output a count result corresponding to the input signal.

According to the above description, in the embodiments of the invention, the reference value generated based on the ruler signal is used to represent a frequency variation of the clock signal, the pulse width of the input signal and the reference value are compared to calculate a relative proportion thereof, so as to obtain the count result corresponding to the input signal. In this way, the influence on the count accuracy caused by environmental variation can be effectively eliminated, so as to achieve the requirement of high resolution, and achieve good energy usage rate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In order to implement a full-digital time to digital converter (TDC) with a high resolution. In an embodiment of the invention, a ruler signal is applied to generate a reference value to represent a frequency variation of a clock signal, and a pulse width of an input signal and the reference value are compared to calculate a relative proportion thereof, so as to obtain the count result corresponding to the input signal. By calculating the relative proportion, the influence on the count accuracy caused by environmental variation can be effectively eliminated. Moreover, the aforementioned architecture may also provide a count function of a fraction portion, so as to effectively improve the resolution and achieve good energy usage rate. On the other hand, based on edge detection of the input signal, besides that the count function is activated when a rising edge of the input signal is detected, whether to execute a count operation can be further determined according to a logic level of the clock signal when a falling edge of the input signal is detected, so as to ameliorate a count accuracy of a last bit. Therefore, an overall resolution of the TDC can be improved.

Figure 1:
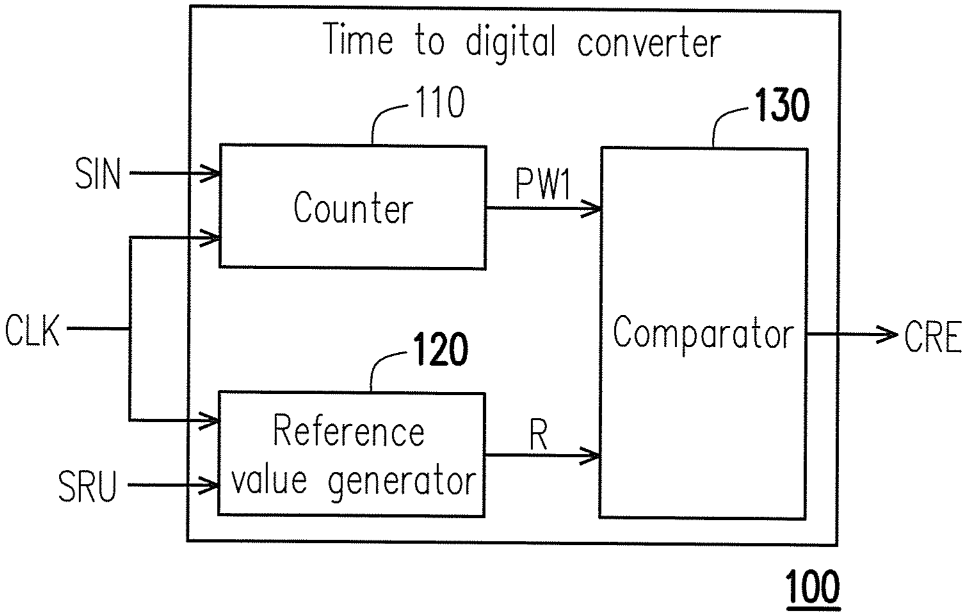
FIG. 1 is a block schematic diagram of a TDC with high resolution according to an embodiment of the invention.

Referring to FIG. 1, FIG. 1 is a block schematic diagram of a TDC with high resolution according to an embodiment of the invention. The TDC 100 includes a counter 110, a reference value generator 120 and a comparator 130. The comparator 130 is coupled to the counter 110 and the reference value generator 120. The counter 110 samples an input signal SIN according to a clock signal CLK to calculate a pulse width PW1 of the input signal SIN. The reference value generator 120 samples a ruler signal SRU according to the clock signal CLK to generate a reference value R. The comparator 130 compares the pulse width PW1 of the input signal SIN and the reference value R to generate a count result CRE.

In the present embodiment, a frequency of the clock signal CLK can be greater than a frequency of the ruler signal SRU, and the frequency of the ruler signal SRU can be greater than a frequency of the input signal SIN. Therefore, in the present embodiment, the ruler signal SRU and the input signal SIN can be respectively sampled according to the clock signal CLK, and a proportion of the pulse width PW1 of the input signal SIN relative to the reference value R (which is referred to as a relative proportion hereinafter) can be calculated to serve as the count result CRE of the input signal SIN.

It should be noted that the reference value generator 120 may sample the ruler signal SRU according to the clock signal CLK, so as to calculate a pulse width of the ruler signal SRU, and periodically latches the pulse width of the ruler signal SRU according to the ruler signal SRU to generate the reference value R. Namely, the variation of the clock signal CKL varied along with environmental parameters can be reflected on the reference value R in real-time. Then, since the comparator 130 counts the pulse width PW1 of the input signal SIN according to the adjusted reference value R, the interference on the count accuracy caused by the environmental variation can be effectively eliminated.

Moreover, the pulse width of the ruler signal SRU is, for example, determined according to a predetermined capacitance variation. The predetermined capacitance variation can be a predetermined value, or can be set by the user. Under such architecture, the ruler signal SRU can be generated through a differential capacitive sensing circuit and a capacitance-to-time converter. To be specific, the differential capacitive sensing circuit can be used for sensing the aforementioned predetermined capacitance variation, and outputting a sensing signal corresponding to the predetermined capacitance variation in a digital format. Then, the capacitance-to-time converter may convert the aforementioned sensing signal into the pulse width of the ruler signal SRU, and provides the generated ruler signal SRU to the TDC 100. Similarly, the input signal SIN is, for example, also determined according to the capacitance variation sensed by the differential capacitive sensing circuit. Therefore, according to another aspect, the TDC 100 of the present embodiment can also be regarded as a capacitance reading circuit, the aforementioned implementation of the ruler signal SRU is only an example, and the invention is not limited thereto.

By the way, in an actual application, the clock signal CLK can be provided by an all-digital phase-locked loop device or other frequency generator, which is not limited by the invention.

Figure 2:
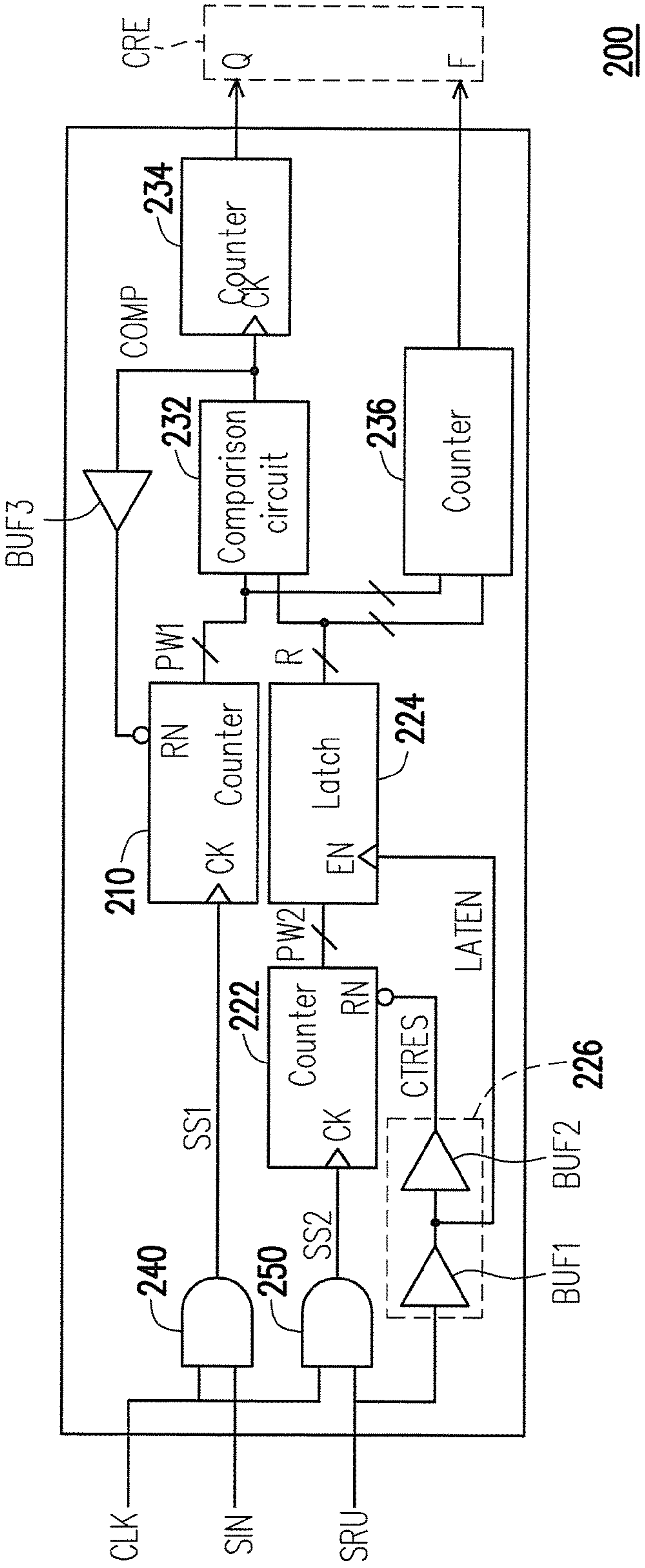
FIG. 2 is a block schematic diagram of a TDC with high resolution according to another embodiment of the invention.

Referring to FIG. 2, FIG. 2 is a block schematic diagram of a TDC with high resolution according to another embodiment of the invention. The TDC 200 includes a counter 210, a reference value generator, a comparator and AND gates 240, 250. The AND gate 240 is coupled to the counter 210, and the AND gate 250 is coupled to the reference value generator. Moreover, the reference value generator may include a counter 222, a latch 224 and a delay circuit 226, and the comparator may include a comparator circuit 232 and counters 234 and 236.

In the present embodiment, the AND gate 240 may receive the clock signal CLK and the input signal SIN, and output a sampling result SS1 for providing to a clock input terminal CK of the counter 210. Therefore, the counter 210 may calculate the pulse width PW1 of the input signal SIN according to a plurality of pulses included in the sampling result SS1. The pulse width PW1 of the input signal SIN is, for example, determined according to the number of pulses included in the sampling result SS1.

On the other hand, the AND gate 250 may receive the clock signal CLK and the ruler signal SRU, and output a sampling result SS2 for providing to a clock input terminal of the reference value generator (for example, a clock input terminal of the counter 222). Therefore, the reference value generator may calculate and generate a reference value R according to a plurality of pulses included in the sampling result SS2. Similarly, the value of the reference value R can be determined according to the number of pulses included in the sampling result SS2.

Regarding a detailed circuit of the reference value generator, in the present embodiment, the counter 222 is coupled to the AND gate 250, the latch 224 is coupled between the counter 222 and the capacitor 230, and the delay circuit 226 is coupled to the counter 222 and the latch 224.

To be specific, the counter 222 may receive the sampling result SS2 output by the AND gate 250 through the clock input terminal CK, and samples the ruler signal SRU according to the clock signal CLK to calculate a pulse width PW2 of the ruler signal SRU. Moreover, the counter 222 may execute a reset operation according to an inverted signal of the ruler signal SRU.

The latch 224 may determine to transmit the pulse width PW2 of the ruler signal SRU to serve as the reference value R or latch the pulse width PW2 of the ruler signal SRU to generate the reference value R according to a logic level of the ruler signal SRU. Namely, the logic level of the ruler signal SRU is used for determining whether to enable the latch 224.

The delay circuit 226 may receive the ruler signal SRU, and sequentially delays the ruler signal SRU to respectively generate a latch enable signal LATEN and a counter reset signal CTRES. The delay circuit 226 outputs the latch enable, signal LATEN to an enable terminal EN of the latch 224, and outputs the counter reset signal CTRES to a reset terminal RN of the counter 222. In the present embodiment, the delay circuit 226 may include buffers BUF1 and BUF2 connected in series with each other. An input terminal of the buffer BUF1 receives the ruler signal SRU, and an output terminal of the buffer BUF1 generates the latch enable signal LATEN. Moreover, an input terminal of the buffer BUF2 is coupled to the output terminal of the buffer BUF1, and an output terminal of the buffer BUF2 generates the counter reset signal CTRES.

In an actual application, the latch 224 is, for example, a D-type flip-flop. Moreover, in other embodiment, the latch 224 can also be implemented by other circuit device having data latching capability, and the latch enable signal LATEN and the counter reset signal CTRES generated by the delay circuit 226 can be adaptively adjusted according to the implementation of the latch 224.

Regarding a circuit detail of the comparator, in the present embodiment, the comparator circuit 232 is coupled to the counter 210 and the reference value generator, the counter 234 is coupled to the comparator circuit 232, and the counter 236 is coupled to the comparator circuit 232 and the reference value generator.

Further, the comparator circuit 232 may compare the reference value R and the pulse width PW1 to output a comparison result COMP, and the counter 234 may receive the comparison result COMP through a clock input terminal CK thereof, and count the comparison result COMP to generate a quotient Q obtained by performing a dividing operation to the pulse width PW1 according to the reference value R. The quotient Q may serve as an integral portion of the count result CRE. Moreover, the counter 236 can be enabled when a remainder obtained by performing the dividing operation to the pulse width PW1 according to the reference value R is not 0. When the counter 236 is enabled, the counter 236 determines a fraction portion F of the count result CRE by comparing the remainder and the reference value R. In the present embodiment, the counter 236, for example, compares whether the remainder is greater than a half of the reference value R to determine the fraction portion F of the count result CRE. In other words, the counter 236 may determine a tenths unit (i.e. the number after the decimal point) of the count result in a rounding manner. Alternatively, in other embodiment, the counter 236 may also calculate a ratio between the remainder and the reference value R, so as to determine the value of the fraction portion F of the count result CRE. Since implementation of calculating the fraction portion is known by those skilled in the art, detail thereof is not repeated.

It should be noted that the step of determining whether the remainder is 0 can be executed by the comparator circuit 232. Alternatively, in other embodiment, the step of determining whether the remainder is 0 can also be executed by the counter 236, which is not limited by the invention.

Moreover, the TDC 200 may further include a buffer BUF3. An input terminal of the buffer BUF3 is coupled to an output terminal of the comparator circuit 232, and an output terminal of the buffer BUF3 is coupled to a reset terminal RN of the counter 210, such that the counter 210 may execute a reset operation according to the comparison result COMP output by the comparator circuit 232. In the present embodiment, the reset terminal RN, for example, receives an inverted signal of the comparison result COMP.

Figure 3:
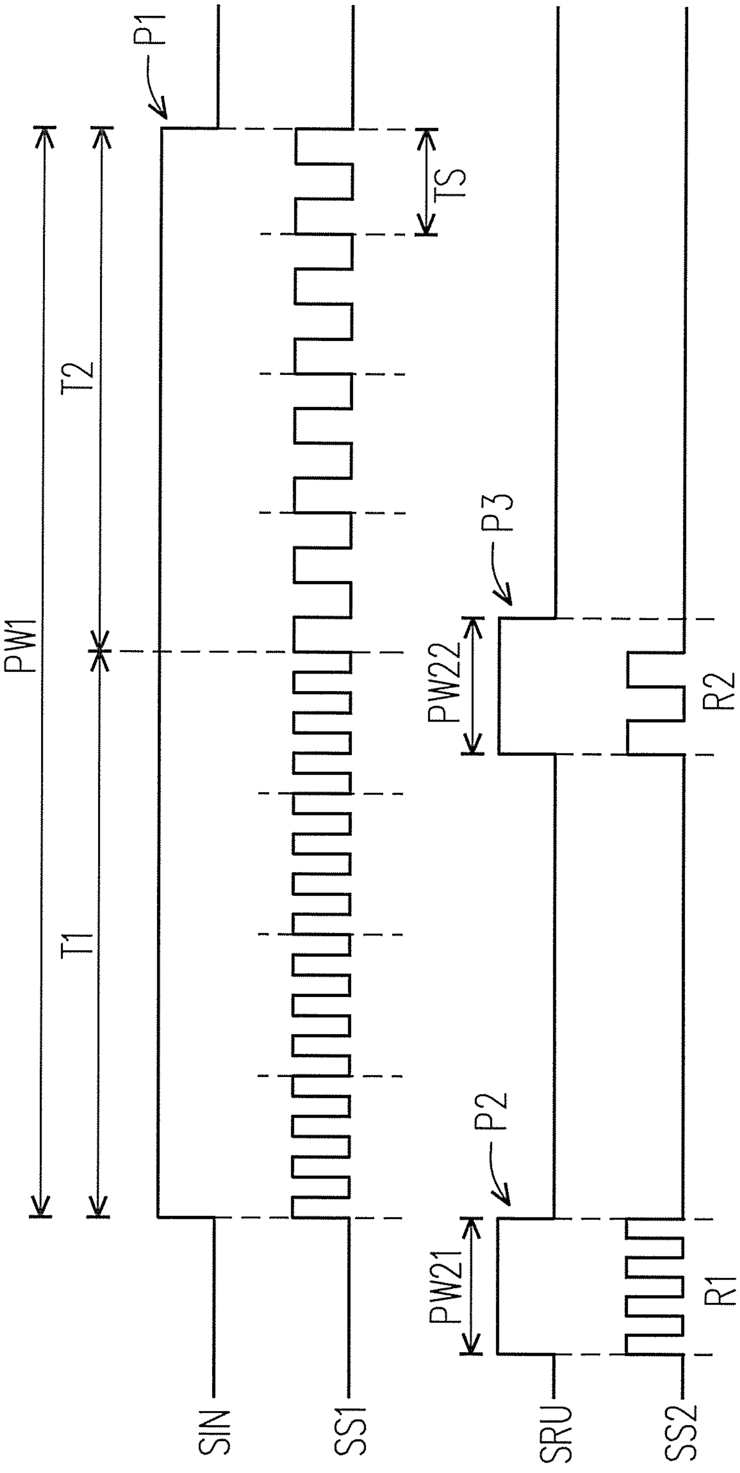
FIG. 3 is a signal waveform diagram of a TDC with high resolution according to an embodiment of the invention.

The operation detail of the TDC 200 is described below with reference of FIG. 2 and FIG. 3. FIG. 3 is a signal waveform diagram of the TDC with high resolution according to an embodiment of the invention. The input signal SIN may include a pulse P1, and a width of the pulse P1 is the pulse width PW1. The ruler signal SRU may include pulses P2 and P3, and the widths of the pulses P2 and P3 can be respectively pulse widths PW21 and PW22. During a pulse period, the logic level of the input signal SIN and the ruler signal SRU is, for example, a high logic level, and during a non-pulse period, the logic level of the input signal SIN and the ruler signal SRU is, for example, a low logic level.

Moreover, the sampling result SS1 can be generated by the AND gate 240 by sampling the input signal SIN according to the clock signal CLK, and the sampling result SS2 can be generated by the AND gate 250 by sampling the ruler signal SRU according to the clock signal CLK. It should be noted that the variation of the environmental parameter can be reflected on the frequency of the clock signal CLK, so that the frequencies of the sampling results SS1 and SS2 are accordingly changed. For example, a frequency of the sampling result SS1 in a section T1 of the pulse width PW1 is different to a frequency of the sampling result SS1 in a section T2 of the pulse width PW1, and a frequency of the sampling result SS2 in the pulse width PW21 is different to a frequency of the sampling result SS2 in the pulse width PW22. Moreover, the frequency of the sampling result SS1 in the section T1 can be the same to the frequency of the sampling result SS2 in the pulse width PW21, and the frequency of the sampling result SS1 in the section T2 can be the same to the frequency of the sampling result SS2 in the pulse width PW22. Therefore, in the present embodiment, the reference values R1 and R2 respectively calculated according to the pulse widths PW21 and PW22 of the ruler signal SRU can be adopted to reflect the frequency variation of the clock signal CLK in real-time, and the widths of the section T1 and the section T2 are respectively calculated in a manner of relative proportion by using the reference values R1 and R2, so as to obtain the count result corresponding to the pulse width PW1 of the input signal SIN.

To be specific, the sampling result SS1 is transmitted to the counter 210 to calculate the pulse width PW1, the sampling result SS2 is transmitted to the counter 222 to calculate the pulse widths PW21 and PW22, and the pulse widths PW21 and PW22 are transmitted to the latch 224 to generate the reference values R1 and R2. The reference values R1 and R2 can be respectively determined according to the number of pulses included in the sampling result SS2 in the pulse widths PW21 and PW22, so that in the present embodiment, the reference value R1 is, for example, 3, and the reference value R2 is, for example, 2.

Moreover, the reference values R1 and R2 can be generated by periodically latching the pulse width of the ruler signal SRU. According to the embodiment of FIG. 2, it is known that the ruler signal SRU can be transmitted to the buffer BUF1 of the delay circuit 226, and the buffer BUF1 delays the ruler signal SRU to generate the latch enable signal LATEN of the latch 224, and the buffer BUF2 delays the latch enable signal LATEN to generate the count reset signal CTRES of the counter 222. Therefore, taking the pulse P2 of the ruler signal SRU as an example, the latch 224 may execute a latch operation to the pulse width PW21 calculated by the counter 222 to generate the reference value R1, and keeps providing the reference value R1 to the comparator circuit 232, such that the comparator circuit 232 may perform operation to the section T1 of the pulse width PW1 according to the reference value R1. Similarly, regarding the pulse P3 of the ruler signal SRU, the latch 224 may execute a latch operation to the pulse width PW22 calculated by the counter 222 to generate the reference value R2, and keeps providing the reference value R2 to the comparator circuit 232, such that the comparator circuit 232 may perform operation to the section T2 of the pulse width PW1 according to the reference value R2.

It should be noted that the counter 222 may executes the reset operation according to an inverted signal of the reset signal CTRES. Namely, once the ruler signal SRU is transited from the high logic level to the low logic level, the counter 222 may clear the calculated pulse width of the ruler signal SRU, and re-calculates the pulse width of the ruler signal SRU when the ruler signal SRU enters a next pulse.

In the present embodiment, the reference value R1 is used for comparing with the section T1 of the pulse width PW1, and the obtained relative proportion of the section T1 and the reference value R1 is 4. Moreover, the reference value R2 is used for comparing with the section T2 of the pulse width PW1, and the obtained relative proportion of the section T2 and the reference value R2 is between 3 and 4. The aforementioned operation is equivalent to a dividing operation, and the counter 234 may output a quotient Q (for example, 7) of the above dividing operation according to the comparison result COMP of the comparator circuit 232, so as to serve as the integral portion of the count result CRE. Regarding the fraction portion F of the count result CRE, the reference value R2 can be compared with a section TS corresponding to a remainder of the aforementioned dividing operation. In the present embodiment, the section TS is greater than a half of the reference value R2, so that the counter 236 may output 5 according to the number after the decimal point of the count result CRE to serve as the fraction portion F of the count result CRE. On the other hand, if the section TS is smaller than the half of the reference value R2, the counter 236 may output 0 to serve as the fraction portion F of the count result CRE. In other words, the aforementioned determination mechanism may adopt rounding to implement the count function of the number after the decimal point.

Figure 4:
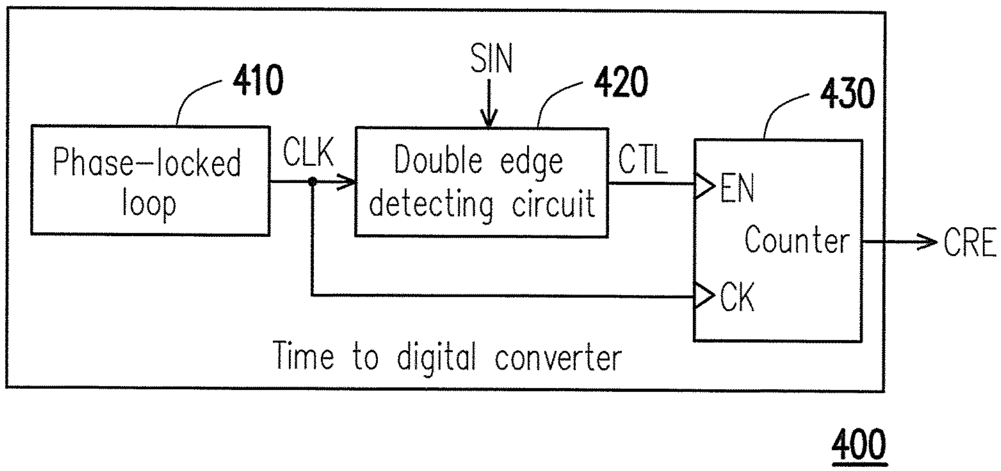
FIG. 4 is a block schematic diagram of a TDC with high resolution according to another embodiment of the invention.

Referring to FIG. 4, FIG. 4 is a block schematic diagram of a TDC with high resolution according to another embodiment of the invention. The TDC 400 includes a phase-locked loop device 410, a double edge detecting circuit 420 and a counter 430. The double edge detecting circuit 420 is coupled to the phase-locked loop device 410, and the counter 430 is coupled to the phase-locked loop device 410 and the double edge detecting circuit 420.

In the present embodiment, the phase-locked loop device 410 may provide a clock signal CLK. The double edge detecting circuit 420 may detect a logic level of the clock signal according to a rising edge and a falling edge of an input signal SIN, and generates a control signal CTL in response to the detected logic level of the clock signal CLK. The counter 430 may determine whether to execute a count operation according to the control signal CTL. When the counter 430 executes the count operation, the counter 430 samples the input signal SIN according to the clock signal CLK to output a count result CRE corresponding to the input signal SIN.

To be specific, the double edge detecting circuit 420 is, for example, implemented by a D-type flip-flop. Under such architecture, a clock input terminal of the D-type flip-flop may receive the input signal SIN, a signal input terminal of the D-type flip-flop may receive the clock signal CLK, and an output terminal of the D-type flip-flop outputs the control signal CTL. Certainly, the double edge detecting circuit 420 can also be implemented by other types of flip-flop or other circuits capable of detecting a signal transition, which is not limited by the invention.

Figure 5:
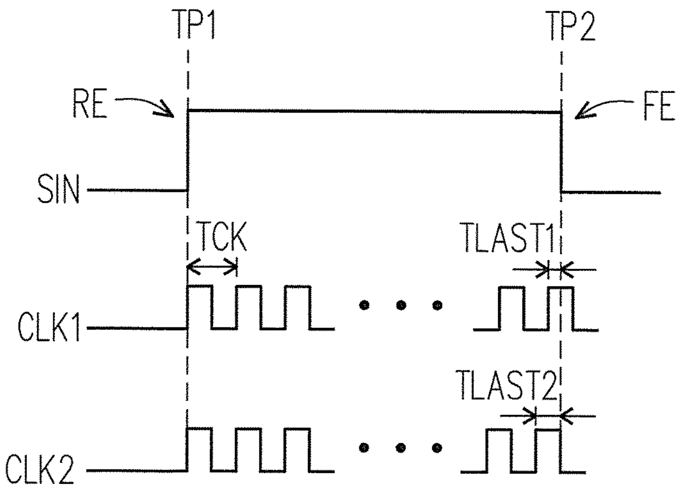
FIG. 5 is a signal waveform diagram of a TDC with high resolution according to another embodiment of the invention.

Operation details of the TDC 400 are described with reference of FIG. 4 and FIG. 5. FIG. 5 is a signal waveform diagram of a TDC with high resolution according to another embodiment of the invention. In the present embodiment, the input signal SIN includes a pulse P1, and the pulse P1, for example, has a high logic level. Moreover, clock signals CLK1 and CLK2 may respectively include a plurality of pulses.

The clock signal CLK1 is described here. After the double edge detecting circuit 420 detects a rising edge RE of the input signal SIN at a time point TP1, during the period that the input signal SIN has the high logic level, the double edge detecting circuit 420 starts to correspondingly generate the control signal CTL according to the logic level of the clock signal CLK1. An enable terminal EN of the counter 430 receives the control signal CTL, and is enabled according to a logic level of the control signal CTL. For example, the counter 430 is enabled when the control signal CTL has the high logic level, and when the counter 430 is enabled, the counter 430 may execute the count operation according to the logic level of the clock signal CLK.

On the other hand, when the double edge detecting circuit 420 detects a falling edge FE of the input signal SIN at a time point TP2, the double edge detecting circuit 420 also correspondingly generates the control signal CTL according to the logic level of the clock signal CLK1. In the present embodiment, one period TCK of the clock signal CLK1 can be determined according to the rising edges of two adjacent pulses. Under the above condition, at the time point T2, if the clock signal CLK1 has the high logic level, it represents that a last section TLAST1 of the clock signal CLK1 between the time points TP1 and TP2 is smaller than a half of one period TCK of the clock signal CLK1, so that it is unnecessary to count the section TLAST1. Now, the control signal CTL output by the double edge detecting circuit 420, for example, has a low logic level.

Taking the clock signal CLK2 as an example, at the time point TP2, the clock signal CLK2 has the low logic level. Namely, a last section TLAST2 of the clock signal CLK2 between the time points TP1 and TP2 is at least greater than or equal to a half of one period TCK of the clock signal CLK1, so that the count operation can be performed according to the section TLAST2. Now, the control signal CTL output by the double edge detecting circuit 420, for example, has the high logic level.

In this way, besides that the count operation can be executed when the rising edge RE of the input signal SIN is detected, the logic level of the clock signal corresponding to the falling edge FE of the input signal SIN can be further determined, so as to determine whether to perform the count operation. In this way, the count accuracy of the TDC 400 can be effectively improved.

Figure 6:
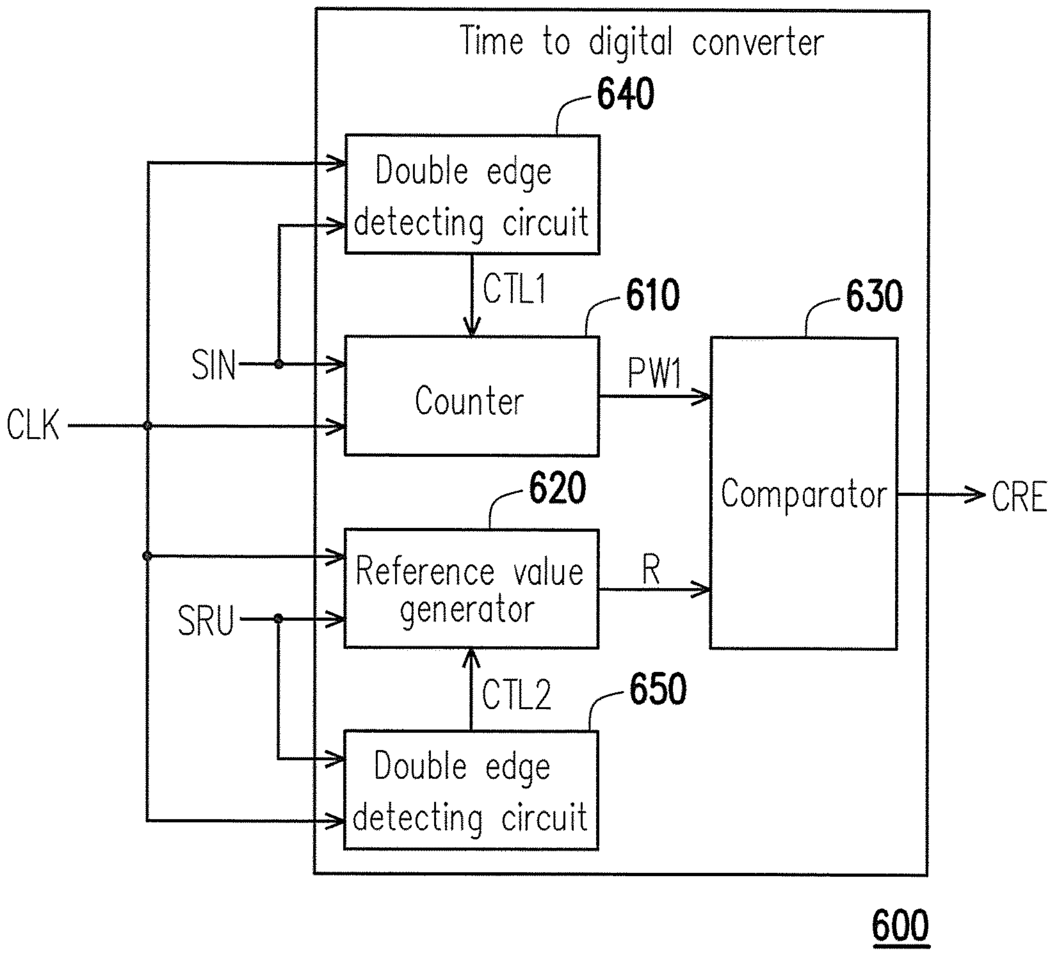
FIG. 6 is a block schematic diagram of a TDC with high resolution according to another embodiment of the invention.

In some other embodiments of the invention, the aforementioned double edge detecting circuit can also be applied to the embodiments of FIG. 1 and FIG. 2. Referring to FIG. 6, FIG. 6 is a block schematic diagram of a TDC with high resolution according to another embodiment of the invention. The TDC 600 of the present embodiment is based on the architecture of the embodiment of FIG. 1, and an operation detail thereof is similar to the aforementioned embodiment, so that detail thereof is not repeated. It should be noted that the TDC 600 of the present embodiment further includes double edge detecting circuits 640 and 650. The double edge detecting circuit 640 is coupled to the counter 610, and the double edge detecting circuit 650 is coupled to the reference value generator 620. The double edge detecting circuit 640 may detect a logic level of the clock signal CLK according to a rising edge and a falling edge of the input signal SIN, and generates a control signal CTL1 in response to the detected logic level of the clock signal CLK, such that the counter 610 determines whether to execute a count operation according to the control signal CTL1. For example, the double edge detecting circuit 640 may provide the control signal CTL1 to an enable terminal of the counter 610, so as to control the operation of the counter 610, and effectively improve the accuracy for calculating the pulse width PW1. The double edge detecting circuit 640 is, for example, implemented by a D-type flip-flop.

On the other hand, the double edge detecting circuit 650 may detect a logic level of the clock signal CLK according to a rising edge and a falling edge of the ruler signal SRU, and generates a control signal CTL2 in response to the detected logic level of the clock signal CLK, such that the reference value generator 620 determines whether to execute a count operation according to the control signal CTL2. For example, the double edge detecting circuit 650 may provide the control signal CTL2 to an enable terminal of a counter in the reference value generator 620, so as to control the operation of the counter, and effectively improve the accuracy for calculating the reference value R. The double edge detecting circuit 650 is, for example, implemented by a D-type flip-flop.

In summary, in the embodiments of the invention, the reference value generated based on the ruler signal is used to represent a frequency variation of the clock signal, and the pulse width of the input signal and the reference value are compared to calculate a relative proportion thereof, so as to eliminate the influence on the count accuracy caused by environmental variation, and achieve good energy usage rate. Moreover, in the embodiments of the invention, the logic level of the clock signal corresponding to the falling edge of the input signal can be detected, so as to determine whether to perform a count operation to the input signal, by which the count accuracy is effectively improved. In this way, the TDC may achieve the requirement of high resolution.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A time to digital converter with high resolution, comprising:

a first counter, sampling an input signal according to a clock signal to calculate a first pulse width of the input signal;

a reference value generator, sampling a ruler signal according to the clock signal to generate a reference value, wherein a frequency of the clock signal is greater than a frequency of the ruler signal, and the frequency of the ruler signal is greater than a frequency of the input signal; and a comparator, coupled to the first counter and the reference value generator, and comparing the first pulse width of the input signal and the reference value to generate a count result, wherein the reference value generator samples the ruler signal according to the clock signal to calculate a second pulse width of the ruler signal, and periodically latches the second pulse width according to the ruler signal to generate the reference value.

2. The time to digital converter with high resolution as claimed in claim 1, wherein the reference value generator comprises:

a second counter, sampling the ruler signal according to the clock signal to calculate the second pulse width of the ruler signal, and executing a reset operation according to an inverted signal of the ruler signal; and a latch, coupled between the second counter and the comparator, and determining to transmit the second pulse width of the ruler signal to serve as the reference value or latch the second pulse width of the ruler signal to generate the reference value according to a logic level of the ruler signal.

3. The time to digital converter with high resolution as claimed in claim 2, wherein the reference value generator further comprises:

a delay circuit, coupled to the second counter and the latch, and receiving the ruler signal, and sequentially latching the ruler signal to respectively generate a latch enable signal and a counter reset signal, wherein the delay circuit outputs the latch enable signal to an enable terminal of the latch, and outputs the counter reset signal to a reset terminal of the second counter.

4. The time to digital converter with high resolution as claimed in claim 3, wherein the delay circuit comprises a first buffer and a second buffer coupled in series to each other.

5. The time to digital converter with high resolution as claimed in claim 1, wherein the second pulse width of the ruler signal is determined according to a predetermined capacitance variation.

6. The time to digital converter with high resolution as claimed in claim 1, wherein the comparator comprises:

a comparison circuit, coupled to the first counter and the reference value generator, and comparing the reference value and the first pulse width to output a comparison result;

a third counter, coupled to the comparison circuit, and counting the comparison result to generate a quotient obtained by performing a dividing operation to the first pulse width according to the reference value; and a fourth counter, coupled to the comparison circuit and the reference value generator, and being enabled when a remainder obtained by performing the dividing operation to the first pulse width according to the reference value is not 0, wherein when the fourth counter is enabled, the fourth counter determines a fraction portion of the count result by comparing the remainder and the reference value.

7. The time to digital converter with high resolution as claimed in claim 6, wherein the first counter executes a reset operation according to the comparison result output by the comparison circuit.

8. The time to digital converter with high resolution as claimed in claim 1, further comprising:

a first AND gate, coupled to the first counter, receiving the clock signal and the input signal, and outputting a first sampling result for providing to a clock input terminal of the first counter; and a second AND gate, coupled to the reference value generator, receiving the clock signal and the ruler signal, and outputting a second sampling result for providing to a clock input terminal of the reference value generator.

9. The time to digital converter with high resolution as claimed in claim 1, further comprising:

a first double edge detecting circuit, coupled to the first counter, detecting a first logic level of the clock signal according to a rising edge and a falling edge of the input signal, and generating a first control signal in response to the detected first logic level of the clock signal, wherein the first counter determines whether to execute a count operation according o the first control signal.

10. The time to digital converter with high resolution as claimed in claim 9, further comprising:

a second double edge detecting circuit, coupled to the reference value generator, detecting a second logic level of the clock signal according to a rising edge and a falling edge of the ruler signal, and generating a second control signal in response to the detected second logic level of the clock signal, wherein the reference value generator determines whether to execute the count operation according o the second control signal.

11. The time to digital converter with high resolution as claimed in claim 9, wherein the double edge detecting circuit is a D-type flip-flop, a clock input terminal of the D-type flip-flop receives the input signal, a signal input signal of the D-type flip-flop receives the clock signal, and an output terminal of the D-type flip-flop outputs the control signal to an enable terminal of the counter.

12. A time to digital converter with high resolution, comprising:

a phase-locked loop device, providing a clock signal;

a double edge detecting circuit, coupled to the phase-locked loop device, detecting a logic level of the clock signal according to a rising edge and a falling edge of an input signal, and generating a control signal in response to the detected logic level of the clock signal; and a counter, coupled to the phase-locked loop device and the double edge detecting circuit, and determining whether to execute a count operation according to the control signal, wherein when the counter executes the count operation, the counter samples the input signal according to the clock signal to output a count result corresponding to the input signal.

* * * * *